United States Patent [19]
Wasa et al.

[11] Patent Number: 4,770,923
[45] Date of Patent: Sep. 13, 1988

[54] PROTECTION FILM STRUCTURE FOR FUNCTIONAL DEVICES

[75] Inventors: Kiyotaka Wasa, Nara; Takashi Hirao, Ikoma; Atsuo Nishikawa, Katano; Seiji Nishino, Osaka; Takeo Ohta, Nara, all of Japan

[73] Assignee: Matsushita Electric Industrial Co., Ltd., Kadoma, Japan

[21] Appl. No.: 800,042

[22] Filed: Nov. 20, 1985

[30] Foreign Application Priority Data

Nov. 20, 1984 [JP] Japan .................. 59-245081

[51] Int. Cl.$^4$ .................. B05D 3/06; B32B 9/00
[52] U.S. Cl. .................. 428/212; 428/698; 428/699; 428/446; 428/448; 428/425.6; 428/425.8; 428/424.4; 427/42; 427/162; 73/73; 206/328
[58] Field of Search ............. 428/698, 699, 446, 212, 428/448; 427/42, 162

[56] References Cited

U.S. PATENT DOCUMENTS

| 3,645,779 | 2/1972 | Kienel .................. 427/42 |
| 4,187,344 | 2/1980 | Fredriksson .................. 428/698 X |
| 4,450,201 | 5/1984 | Brill et al. .................. 428/698 X |

FOREIGN PATENT DOCUMENTS 0123223 10/1984 European Pat. Off. .
84/02289 6/1984 World Int. Prop. O. .

OTHER PUBLICATIONS

Patent Abstracts of Japan, vol. 9, No. 64, 23 Mar. 1985; & JP A 59 198 544, 10-11-84.
Patent Abstracts of Japan, vol. 7, No. 262, 22 Nov. 83; & JP A 58 143 446, 26-08-83.

Primary Examiner—P. C. Ives
Attorney, Agent, or Firm—Cushman, Darby & Cushman

[57] ABSTRACT

An inorganic protection film (12) such as of silicon nitride for protecting humidity-sensitive functional devices (16) on the substrate from water molecules (15) is formed on an organic substrate (11) such as one made of polycarbonate plastic material, with a soft buffer interface film (13) between the substrate and the protection film, and the buffer film releases stress due to the difference of thermal expansion coefficients of the organic substrate and the protection film.

5 Claims, 3 Drawing Sheets

PROTECTION FILM STRUCTURE FOR FUNCTIONAL DEVICES

BACKGROUND OF THE INVENTION

1. Field of the Invention

The present invention relates generally to a protection film structure for functional devices, and particularly to the protection film structure for functional devices which are protected from humidity, for instance: a sensor array, memory devices, a magnetic recording medium, etc.

2. Description of the Related Art

Protection film for protecting a functional device, functional film structure or functional material has been used to improve reliability of the functional device or the like. For such protection film, hitherto inorganic material such as silicon oxide, glass, etc. and organic materials such as polyimido, Varilene (trade mark), etc. have been used. These protection films have been used in limited uses for protecting small areas, but recent technology requires protection of large areas of functional devices such as sensor arrays, recorded discs, recorded tapes, etc. to improve resistance against humidity and abrasion.

Especially, recent development of electronic devices strongly requires forming of a protection film which has a different thermal expansion coefficient from that of the substrate, or forming of a uniform protection film under a low temperature such as room temperature.

However, the conventional art has not been able to provide a satisfactory protection film configuration to satisfy the above-mentioned requirements both in characteristics and from an economic view point.

The inventors experimentally found a novel construction of a protection film structure for functional devices which can satisfactorily fulfil the above-mentioned requirements.

SUMMARY OF THE INVENTION

The primary purpose of the present invention is to provide a protection film structure having a high mechanical strength and one which is capable of certainly protecting a substrate and functional devices mounted to the substrate, from humidity.

Another purpose of the present invention is to provide a protection film structure capable of protecting a substrate having functional devices thereon, which has a high bonding force and a high resistance against humidity.

Still another purpose of the present invention is to provide a protection film structure for protecting functional devices successfully formed on a substrate by providing dense and mechanically strong protection film of different thermal expansion coefficient and hardness on an organic substrate by forming a buffer film between the substrate and the protection film.

Still another purpose of the present invention is to provide a protection film structure for functional devices formed on an organic substrate, capable of having high reliability.

The protection film structure for functional devices in accordance with the present invention comprises an inorganic humidity-protection film formed on a substrate and a buffer film formed between the substrate and the inorganic humidity protection film, the buffer film being adapted for releasing stress due to difference of thermal expansion coefficients of the substrate and the inorganic protection film.

DESCRIPTION OF THE PREFERRED EMBODIMENTS

Figure 1:
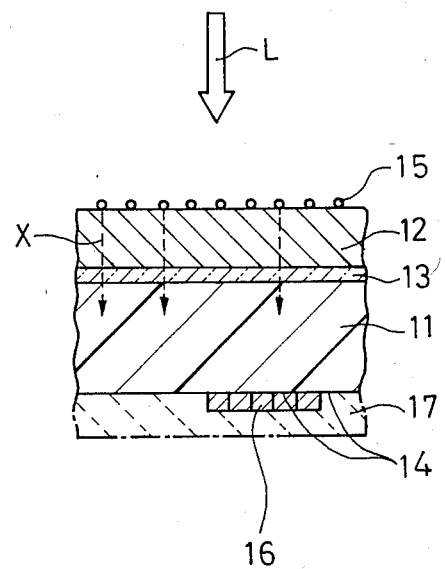
FIG. 1 is a sectional view of a first preferred embodiment of a substrate-mounted humidity-sensitive functional device protected by a protection film structure provided in accordance with the present invention.

A first preferred embodiment in accordance with the present invention is shown in FIG. 1 which is a sectional view of a protection film structure for functional devices of the present invention. As shown in FIG. 1, one surface of a substrate 11 of an organic material is covered by a protection film 12 with a bond film 13 which serves as a buffer layer between the substrate and the protection film. On the other surface 14 of the substrate 11, one or more known functional devices 16, such as photosensor film, etc. are formed. An arrow L indicates light impinging on the functional device 16.

According to the above-mentioned configuration and construction, water molecules 15 otherwise coming towards the sensor thin film 16 through the substrate are prevented from reaching the sensors 16 by the protection film 12. Of course, a known passivation film 17 may be formed to protect the rear side of the functional device thin film 16. In a non-illustrated modification, two sets of the above-mentioned configurations of elements 12, 13, 11, 16 may be bonded to one another in such a manner that the respective photosensor thin films 16, 16 are facing each other, with a suitable adhesive film between them.

In the above-mentioned configuration, for the material of the substrate, organic materials such as film shaped or sheet shaped acrylate polystyrene, polycarbonate, polyethylene, polyester, vinyl chloride, etc. are used for the sake of their easiness of forming and their plasticity. A substrate comprising the above-mentioned materials generally contains water molecules therein and has a characteristic to pass them therethrough, and so, there is a necessity of taking utmost measures to prevent intrusion of the water molecules to the functional devices 16 through the substrate 11 of organic material in order to avoid deterioration of the functional devices due to the water molecules. Accordingly, in order to improve the humidity-resistance of humidity-senitive devices in such a configuration, there is a necessity of providing a protection film 12 on the substrate 11 to prevent the intrusion of water molecules to the functional devices 16. An such protection film 12 must have a large mechanical strength in view of mechanical protection of the functional devices.

In accordance with the above-mentioned reasons, as the protection film 12 to be formed on the substrate 11, a protection film of inorganic material is more appropriate than a film of organic material, and by utilization of such a strong inorganic film as the protection film structure, intrusion of water molecules as suggested by small arrows X, X . . . of FIG. 1 into the substrate 11 is prevented.

In the above-mentioned configuration, if an inorganic protection film such as quartz glass is used, because of the large difference of thermal expansion coefficients and mechanical strengths between the substrate 11 and the protection film 12, a considerable stress is generated therebetween, thereby to break the protection film 12 or make cracks thereon and the result is a poor and impractical bonding force.

Hitherto, in an art of forming the inorganic protection film on an organic material substrate, such as forming aluminum metal film on a resin substrate, and organic film has been provided as a bonding film between the inorganic protection film and the organic material substrate. Though the aluminum, which is a soft material, among the inorganic materials is easily bonded on the organic material substrate, a very much harder material, such as silicon niride or silicon carbide as a protection film is considered to be hardly bondable to an organic material substrate.

However, the present inventors have found that a protection film structure having a high and effective bonding force and desirable humidity resistance characteristic and a strong mechanical strength can be formed by providing a buffer film 13 between the substrate 11 and the protection film 12, so that stress due to the difference of thermal expansion coefficients between the substrate 11 and the protection film 12 is relieved and cracking or breaking down of the protection film can be avoided, thereby making the inorganic protection film practically usable.

That is, the present inventors have found that when a thin film of polyurethane is used as the bond film 13 to serve as a buffer film, and silicon nitride or silicon oxynitride containing oxygen atoms, as the protection film 12, water molecule absorption of an organic substrate 11 in a humid atmosphere substantially decreases. Since heat resistivity of the organic substrate 11 is as low as about 100° C., the forming of the inorganic protection film 12 of silicon nitride thin film is made by sputtering or by the plasma CVD method and the protection film is thereby formed at a temperature of under 100° C. The silicon nitride thin film is amorphous, and chemical constituency thereof need not be in stoichiometric amounts precisely equivalent to the proportions in $Si_3N_4$ (which is widely used in the conventional semiconductor IC manufacturing process), but only inclusion of silicon and nitrogen is sufficient, and excessive amounts of either of silicon or nitrogen in the thin film in relation to such stoichiometric amounts is not a problem.

As the bond film 13 which serves as the buffer film, a silicon oxide film may be used. For instance, the present inventors have found that when a silicon oxide film of 100 Å or thinner is formed as the buffer film 13 and a silicon nitride film 12 is formed thereafter, an improvement by 50% in bonding force in comparison with another case wherein a silicon nitride protection film 12 is directly formed by a plasma CVD process on a substrate 11 of polycarbonate. For instance, the tensile strength of the embodiment of the present invention was 315 g/mm$^2$ while that of the control was 135 g/mm$^2$. The thickness of the bonding film 13 of the embodiment was about 0.1–10 μm, and it is found that when the thickness is more than 10 μm the surface of the protection film 12 loses evenness and utility, and when the thickness is smaller than 0.1 μm, the forming of the bonding film 13 becomes non-uniform, though not fatally defective for utility. It is a requirement that the bonding film 13 be softer than the substrate 11, having a large flexibility, and having good wetting with the protection film 12 is preferable. As a material of the bond film 13, a wide range of organic material other than the polyurethane resins may be used.

Figure 2:
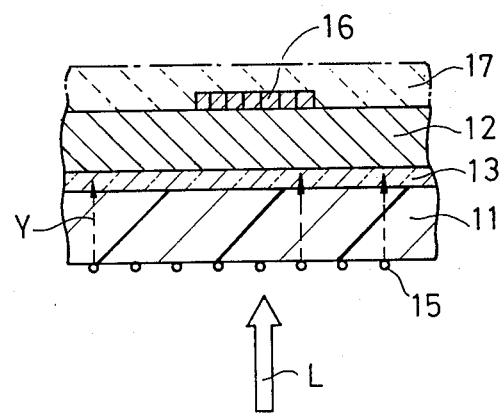
FIG. 2 is a sectional view of a second preferred embodiment in accordance with the present invention.

Furthermore, as shown in FIG. 2, the protection film structure for functional devices in accordance with the present invention can be formed between the organic substrate 11 and the functional devices 16 so that water molecules otherwise passing through the organic substrate 11 can be prevented from doing so by the protection film 12. That is, in the case of the embodiment which is shown in FIG. 2, the humidity which comes through the substrate 11 is prevented by the protection film 12 from reaching the functional devices 16 formed on the protection film 12.

Concrete embodiments of the present invention are described hereafter.

EXAMPLE 1

Figure 3:
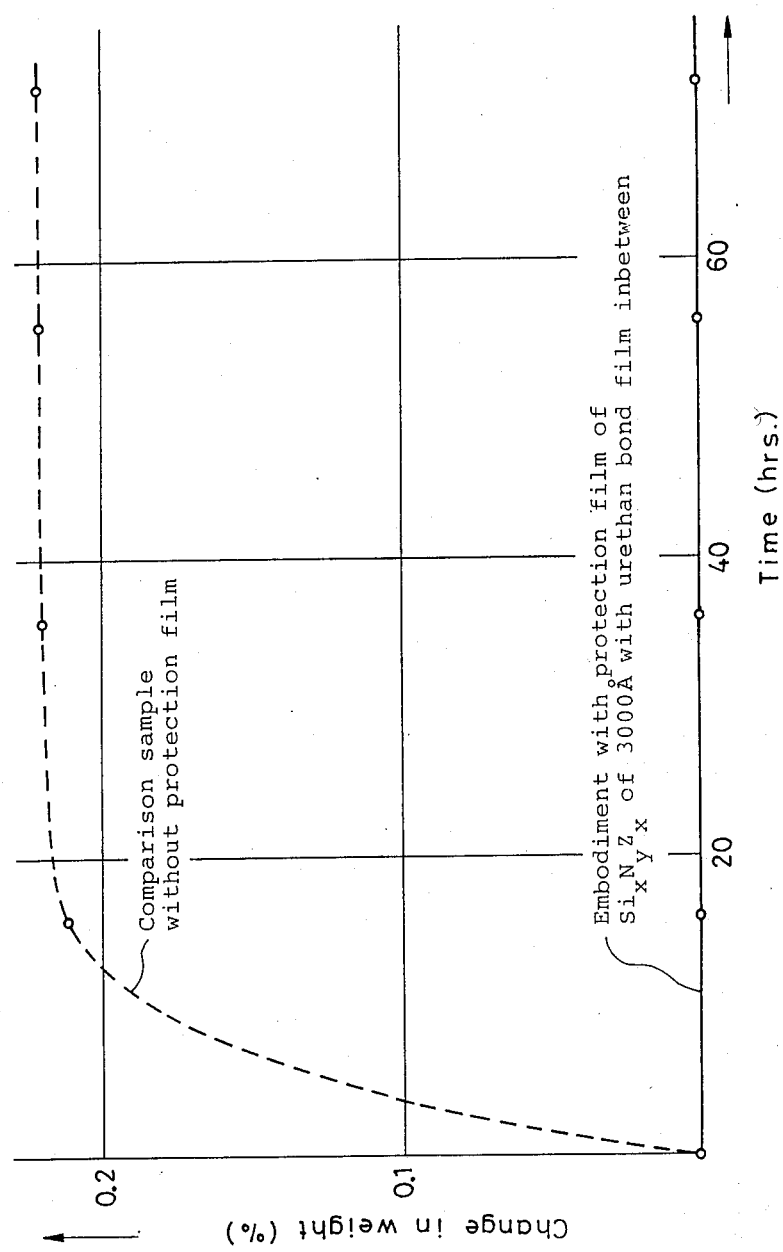
FIG. 3 is a graph showing time change of humidity-resistance characteristic of the embodiments in accordance with the present invention.

A polycarbonate substrate having a flat front face and a flat rear face and 5 mm thickness is used as the substrate 11. The substrate is heat-treated at 90° C. for 10 hours to remove water molecules contained therein and ones which are disposed on the surfaces of the substrate. This heat treatment is important for certainly and reliably forming a bonding layer 13 and a protection layer 12 thereon. On all of the front face of the heat-treated substrate 11, a thermo-hardening polyurethane resin is formed by the spin-coating method, to a thickness of 2 μm, and, thereafter, a heat treatment is applied at 80° C. for 10 hours to harden the polyurethane resin film, thereby to form the bonding film 13. Then, by means of the known plasma CVD process, the protection film 12 of silicon nitride thin film of 0.3 μm thickness is formed, keeping the substrate at 80° C., thereby to form the protection film 12. Then, the polycarbonate substrate, with the protection film, is put in a warm, humid atmosphere of 80° C. and 85% RH for 50 hours, and the resultant sample is compared with a comparison sample which has no protection film 12 but subjected to the same conditions. The water absorption characteristics of the above-mentioned embodiment and the comparison sample are shown in FIG. 3, wherein the embodiment with the protection film has less than 0.01% of water absorption as shown by the curve plotted with white circles and the comparison sample without the protection film shows absorption of over 0.2% as shown by the curve plotted by black circles.

EXAMPLE 2

Figure 4:
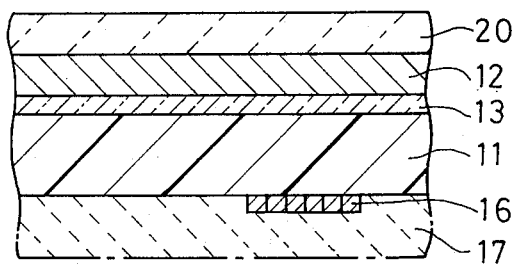
FIG. 4 is a sectional view of a third embodiment in accordance with the present invention.

With reference to FIG. 4, first, by means of the process elucidated in EXAMPLE 1, on an organic resin substrate 11 of polycarbonate, a protection film 12 of an inorganic substance such as silicon nitride is formed with a buffer film 13 of a plastic resin such as polyurethane resin 13, and further on the surface of the inorganic protection film 12 an inorganic water-repellant surface film, such as silicon carbide thin film 20 of about 100 Å thickness, is formed by the known plasma CVD method, while keeping the underlying protection film 12 at 80° C. An electron beam diffraction image shows that the silicon carbide thin film 20 was amorphous and that an infrared absorption spectrum showing bonding between silicon and carbon was observed. When the electrical resistance of the surface was measured in a warm and humid atmosphere by retaining the resultant compound protection film in an atmosphere of 90° C. and 95% RH for a considerable time, no change from dry state was observed and a satisfactory water repellant characteristic was observed. Change of water molecule absorption by the polycarbonate substrate in the warm and humid atmosphere showed a very small value which is less than ½ of the value where the silicon carbide surface film 20 was not provided.

As can be understood from the above-mentioned embodiments, the protection film structure in accordance with the present invention enables effective bonding of the inorganic protection film 12 or composite protection film 12+20 on the organic material substrate 11 and can increase humidity-resistance, and furthermore, the obtained protection film 12 is dense and mechanically strong.

Since the optimum value of thickness of the protection film 12 is dependent on the functional devices 16 formed on he organic substrate 11, the thickness is not necessarily limited to the range disclosed in connection with the above-mentioned embodiments.

For the protection film 12, any composition having a chemical composition principally of silicon nitride and besides containing oxygen and carbon may be used, and a similar effect to that obtained when using only the silicon nitride is obtainable. In such a modified protection film, it is better to increase the oxygen concentration so as to make silicon oxide a principal component at the vicinity of the interface between the protection film 12 and bonding film 13, to increase bonding force. The present inventors also have confirmed that when the protection film is very thin, for instance, between about 100 Å and about 0.3 μm, the silicon oxide serves the function of the bonding film 13. In addition, it has been experimentally confirmed by the present inventors that hardness of the bonding film 13 serving as the buffer film should be smaller than that of the protection film 12.

Besides the above-mentioned silicon oxide, tin oxide, indium oxide, lead oxide, titanium oxide, or the like metal oxides are effective as the bonding film 13.

Apart from the above-mentioned examples, in which the substrate 11 is made of an organic material, in case water repellant surface films are provided constituting with the protection film composite protection film, the present invention is also effective for cases in which the substrate is metal, semiconductor, glass, ceramics or the like inorganic materials.

The protection film structure for functional devices in accordance with the present invention is widely applicable for not only semiconductor devices or electronics components, but also for optical disks, optomagneto memory sheets, magnetic tape, optoelectric sensor arrays, or like devices having large areas to be protected by the protection film, and the utility of the invention is very high.

Figure 5:
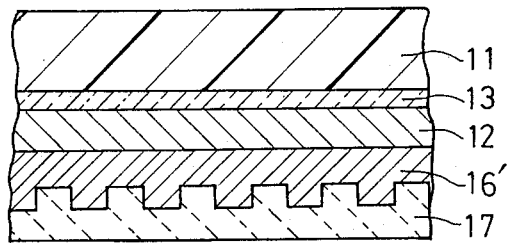
FIG. 5 is a sectional view of a fourth embodiment in accordance with the present invention.

One example of application of this invention to an optical disk is shown in FIG. 5, wherein on a disk-shaped substrate of organic polycarbonate material, an inorganic protection layer 12 of silicon nitride or silicon carbide is provided with a buffer film 13 of silicon oxide, and on the protection film 12 a recording film 16' having data recording grooves and made of $TeO_x$ or TeC as the functional device, are provided, and further thereon, a known passivation film 17 is provided. This optical device is used by irradiating light L from the surface of the substrate 11. The optical disk has a stable performance since the surface of the optical grooves is protected by the strong inorganic protection film 12.

What is claimed is:

1. A protection film structure for protecting a functional device from water comprising:
    a substrate body having two opposite sides;
    a protection film covering one said side of said substrate body and being secured thereto via a layer of bonding film;
    said substrate body being made of a material selected from the group consisting of acrylate polystyrene, dehydrated polycarbonate, polyethylene, polyester, polyvinylchloride;
    said protection film being an inorganic film containing silicon and nitride atoms, not necessarily in a stoichiometric proportion equivalent to silicon nitride;
    said substrate body and said protection film having different coefficients of thermal expansion relative to one another;
    a humidity-sensitive functional device having a front side mounted on said protection film;
    said functional device being constituted by at least one of a photosensor film, a semiconductor, an electronics component, an optical disk, an optomagneto memory sheet, a magnetic recording tape, an optoelectronic sensing array, and a recording film having recording grooves and made of at least one of $TeO_x$ and TeC;
    said bonding film being formed between said substrate body and said protection film and having a hardness which is smaller than that of said protection film;
    said bonding film being arranged to release stress due to difference in thermal expansion coefficients between said substrate body and said protection film;
    said bonding film including at least one buffer layer made of at least one oxide selected from the group consisting of silicond oxide, tin oxide, indium oxide, lead oxide and titanium oxide, said bond film being in the range of 1.0 to 10 μm thick; and
    a passivation film protecting a rear side of said functional device, said passivation film being formed on said protection film in a manner to cover said rear side of said functional device.

2. The protection film structure of claim 1, wherein:
    said bonding film is made of silicon oxide and is from 100 Å to 0.3 μm in thickness.

3. The protection film structure of claim 2, wherein:
    said protection film is made of one of silicon nitride and silicon oxynitride.

4. The protection film structure of claim 3, wherein:
    said silicon nitride is amorphous in structure.

5. A protection film structure for functional devices in accordance with claim 1, wherein
    said substrate body is of polycarbonate and
    said protection film is of low-temperature-plasma-CVD silicon nitride or of low-temperature-plasma-CVD silicon oxynitride.

* * * * *